(12) United States Patent
Chen et al.

(10) Patent No.: US 7,235,424 B2
(45) Date of Patent: Jun. 26, 2007

(54) METHOD AND APPARATUS FOR ENHANCED CMP PLANARIZATION USING SURROUNDED DUMMY DESIGN

(75) Inventors: Hsien-Wei Chen, Sinying (TW);
Hao-Yi Tsai, Hsinchu (TW);
Hsueh-Chung Chen, Yonghe (TW);
Shin-Puu Jeng, Hsinchu (TW);
Jian-Hong Lin, Yunlin (TW);
Chih-Tao Lin, Hsin-Chu (TW);
Shih-Hsun Hsu, Keelung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/181,433

(22) Filed: Jul. 14, 2005

(65) Prior Publication Data

US 2007/0015365 A1    Jan. 18, 2007

(51) Int. Cl.
*H01L 21/00* (2006.01)
(52) U.S. Cl. ............ 438/107; 716/8; 257/E21.151
(58) Field of Classification Search ............ 438/107; 257/E21.151; 716/8
See application file for complete search history.

(56) References Cited

U.S. PATENT DOCUMENTS

| 5,441,915 | A |   | 8/1995 | Lee |
| 5,790,417 | A | * | 8/1998 | Chao et al. ............ 716/21 |
| 5,798,298 | A |   | 8/1998 | Yang et al. |
| 5,926,733 | A |   | 7/1999 | Heo |
| 6,448,630 | B1 |  | 9/2002 | Komori |

OTHER PUBLICATIONS

Brian Lee et al., "Using Smart Dummy Fill and Selective Reverse Etchback for Pettern Density Equalization", Proc. CMP-MIC, pp. 255-258, Santa Clara, CA, Mar. 2000.

\* cited by examiner

*Primary Examiner*—Michelle Estrada
*Assistant Examiner*—Nicholas J. Tobergte
(74) *Attorney, Agent, or Firm*—Duane Morris LLP (57) ABSTRACT

In one embodiment, the disclosure relates to a method and apparatus for inserting dummy patterns in sparsely populated portions of a metal layer. The dummy pattern counters the effects of variations of pattern density in a semiconductor layout which can cause uneven post-polish film thickness. An algorithm according to one embodiment of the disclosure determines the size and location of the dummy patterns based on the patterns in the metal layer by first surrounding the metal structure with small dummy pattern and then filling any remaining voids with large dummy patterns.

16 Claims, 8 Drawing Sheets

METHOD AND APPARATUS FOR ENHANCED CMP PLANARIZATION USING SURROUNDED DUMMY DESIGN

BACKGROUND

Semiconductor device geometries have dramatically decreased in size since such devices were first introduced several decades ago. Since then, integrated circuits have generally followed the two year/half-size rule (often called Moore's Law), which means that the number of devices on a chip doubles every two years. Today's fabrication plants are routinely producing devices having 0.35 µm and even 90 nm feature sizes. Fabrication of electronics devices typically entails designing components defined by a multitude of microelectronic circuits. Using fabrication technology, several microcircuits can be integrated on a single chip to form an integrated circuit ("IC").

Formation of interconnects between various regions of an IC circuit is a conventional and necessary step of design and fabrication process. The interconnects are coated with one or more layers, including dielectric layers, in subsequent steps of the fabrication process. Because the interconnects often protrude from the surface of the substrate, the subsequently coated layers will have an uneven surface. When subjected to a chemical mechanical polishing process, the unevenness creates a pattern which can have considerable undesirable effects in the manufactured product. The unevenness in effective pattern density often results in uneven post-polish film thickness.

To assess the effect of the various layout features on how the region polishes over time a pattern density map is typically constructed. The pattern density map defines how the neighboring features of a particular region of the substrate affect how that region polishes over time. To take into consideration the actual pressure distribution of the CMP polish pad, the neighboring features have to be weighted appropriately when assessing the region's density. The effective density map is conventionally produced by first partitioning the global layout into local cells and then using a filter to weight the effect of local density for each cell. The effective density maps are particularly useful in predicting the polish response of the coated IC.

The conventional methods for addressing the uneven effective pattern density include reverse etch-back and dummy fill. In reverse etch-back the film thickness in areas of high density with large spans of raised areas is reduced by etching in order to form an even film ("planarization"). The dummy fill method a layout step is added to the design process by modifying the circuit layout to include fill structures which act to raise the density of the low density regions. The fill structure, also called dummy fills, serves no electrical or electronic function; rather they are added to level the unevenness in the subsequent layers. In other words, the additional features provided by the dummy fills raise the density of a specific region of the layout to make it on par with the balance of the IC.

Conventional dummy fills are defined by a single dummy feature arranged over the entire layout in an array which excludes the regions featuring the actual interconnect(s). The exact shape and dimensions of the dummy structure is often dictated by the design rules of the underlying layout. An algorithm that analyzes the original layout pattern density distribution and devises a fill structure for minimize the resulting effective pattern distribution of the layout is a smart dummy fill.

Figure 1:
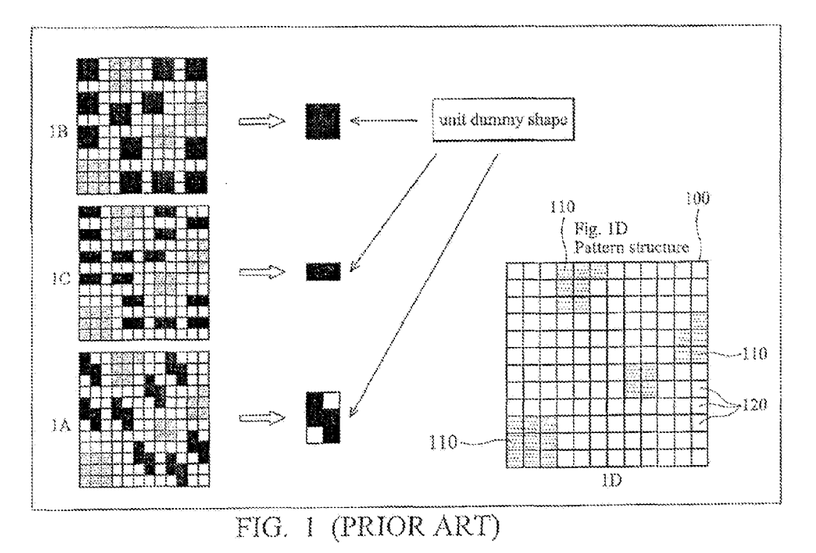
FIGS. 1A–1D schematically represent conventional dummy fill structures.

In addition, the conventional technology uses dummy patterns with identical shape and dimension. The fill dummy is repeated in an array to form a complete pattern. The repeating units of the conventional dummy pattern structure may comprise of different shapes such as square- or rectangular-shaped fills. FIGS. 1A–1D schematically represent conventional dummy fill structures. Specifically, each of FIGS. 1A, 1B and 1C show a different unit dummy shape. FIG. 1D shows conventional pattern structure 100 with dummy patterns 100 scattered throughout the substrate. The conventional methods used a repeating pattern to fill the blank regions (interchangeably, "extended regions") of the substrate. For example, in FIG. 1B, a repeating square pattern is used to fill the extended regions of the substrate. In FIG. 1C, abutting rectangular dummy fills to cover the extended regions of the substrate. Finally, in FIG. 1A, overlapping rectangular dummy fills are used to address the pattern density distribution by filling the extended regions of the substrate.

A disadvantage of the conventional method and using predefined shapes is that the repeated dummy structure can be affected by the boundary-restriction effect. That is, the convention method ignores the many interferences at the boundaries of the layout structure which will restrict the placement of the dummy fill. Another disadvantage of the conventional method is the lack of density control. The insertion of uniform dummy fills creates inflexibility with respect to the dummy pattern density. Still another disadvantage is the layout dependency which will not address the lack of palanarization in the final structure. Finally, the conventional dummy insertion algorithm will result in the asymmetric dishing effect and Rs variation (board level simulation result) which can be as large as 7% for the future generation having gate length of less than 65 nm.

Additionally the repeated dummy shapes and different dimensions of the dummy structures lack density control around the circuit pattern and smart dummy fill approach. These and other drawbacks reduce the dummy fill's ability to effectively control the process variations caused by the proceeding CMP processes.

SUMMARY OF THE DISCLOSURE

In one embodiment, the disclosure relates to a method for generating dummy pattern to eliminate film pattern density mismatch by providing a substrate having a layout pattern density distribution thereon, the layout pattern density distribution defined by at least one interconnect on the surface of the substrate; defining a first fill pattern having a plurality of small dummy fills, the first fill pattern defining an array of small dummy fills corrugating a trace the interconnect; identifying an extended region on the surface of the substrate, the extended region excluding the small dummy fills and the interconnect; defining a second fill pattern, the second fill pattern having at least one large dummy fill covering a portion of the extended region. The second fill pattern defines an array independent of an array formed by the first fill pattern.

In another embodiment a so-called forbidden area can be established at regions of immediate periphery of the interconnect. The forbidden area can define the region interposed between the interconnect and either or both of the small or the large dummy fills. The forbidden area can be configured symmetrically surround the interconnect.

In another embodiment, the disclosure is directed to a microprocessor comprising a substrate having an interconnect thereon; a first fill pattern defining an array of small dummy fills corrugating a trace adjacent the interconnect; a second fill pattern defining an array of large dummy fills formed on a region of the substrate not populated by the interconnect and the first fill pattern; wherein the first fill pattern and the second fill pattern are configured independently of each other.

In still another embodiment, the disclosure concerns a machine-readable medium having stored thereon a plurality of executable instructions for execution by a processor to implement a smart dummy fill algorithm. The executable instructions including providing a substrate having a layout pattern density distribution thereon, the layout pattern density distribution defined by at least one interconnect on the surface of the substrate; defining a first fill pattern having a plurality of small dummy fills, the first fill pattern defining an array of small dummy fills corrugating a trace encompassing the interconnect; identifying an extended region on the surface of the substrate, the extended region excluding the small dummy fills and the interconnect; defining a second fill pattern, the second fill pattern having at least one large dummy fill covering a portion of the extended region; wherein the second fill pattern defines an array independent of an array formed by the first fill pattern.

BRIEF DESCRIPTION OF THE DRAWINGS

The disclosure is described with reference to the following non-limiting and exemplary illustrations in which similar elements are numbered similarly and where.

DETAILED DESCRIPTION OF THE DISCLOSURE

The disclosure relates to an apparatus and a method for implementing a design for an effective polish prevention pattern. More specifically, the disclosure relates to a semiconductor device having a polish preventing pattern for preventing formation of uneven surfaces when an interlayer oxide film is planarized by CMP in subsequent processing steps.

Figure 2:
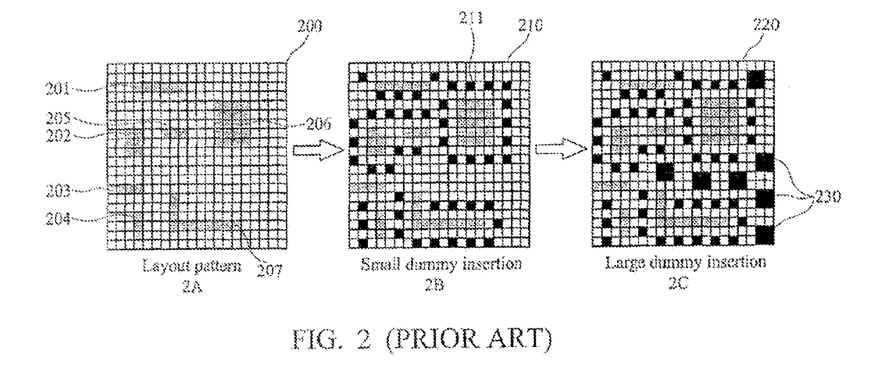
FIGS. 2A–2C schematically illustrate a method according to one embodiment of the disclosure.

FIG. 2 schematically illustrate a method according to one embodiment of the disclosure. Referring to FIG. 2A, a layout pattern depicting substrate 200 having a layout pattern distribution of seven interconnects (201, 202, 203, 204, 205, 206 and 207) on the surface thereof. Substrate 200 is subdivided to smaller cells. The interconnects are dispersed over the substrate according to the system architecture. In accordance with one embodiment of the disclosure as shown in FIG. 2B, a first fill pattern having a plurality of small dummy fills 211 are formed around each of the seven interconnects.

In one embodiment, the first fill pattern defines an array of small dummy fills forming a corrugated trace about each interconnect. The corrugated trace may encircle or surround the interconnect. Alternatively, the corrugated trace may partially surround the interconnect. If two or more interconnects are located proximal to each other, there may not be enough space to encircle each interconnect individually. This is shown, for example, by the first fill pattern tracing interconnects 202 and 205.

While the resulting substrate 210 has a more even pattern density, there are still regions of the substrate that lack uniform pattern density (i.e., extended regions). Such regions are can be identified by inspecting the illustrative substrate 210 in FIG. 2B. To address the unevenness of the extended regions, and with reference to FIG. 2C, a second fill pattern is defined as having at least one large dummy fill covering a portion of the extended region. The terms small dummy fill and large dummy fills as used herein are relative terms and they can be interchanged without departing from the spirit of the disclosure. Referring to FIG. 2C, large dummy fills 230 are formed at the extended region of substrate 220 to provide a more even pattern density.

Referring specifically to FIGS. 2B and 2C it can be seen that each interconnect is surrounded by an immediate forbidden region. The forbidden region appears at the periphery of the interconnects and is the region without any fill pattern. Referring to interconnects 206 and 207, for example, the forbidden region is interposed between the interconnect and the closest fill pattern. In one embodiment, the forbidden region is symmetric about the interconnect. That is, the forbidden region is symmetrically disposed around the interconnect.

Figure 3:
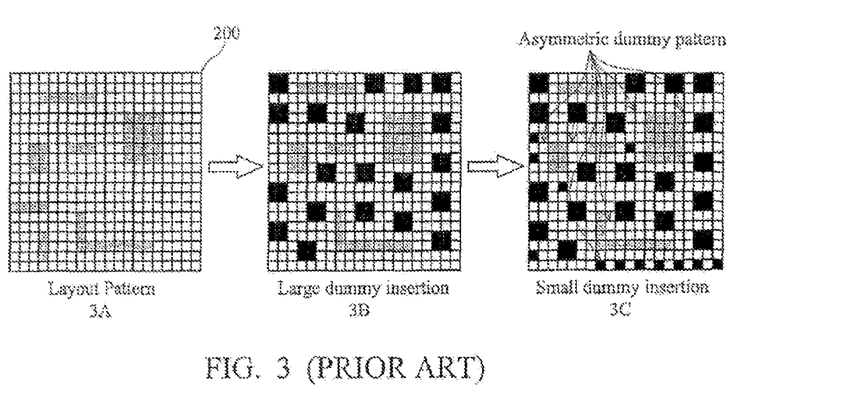
FIGS. 3A–3C comparatively illustrate the deficiencies of the prior art structure as compared with an embodiment of the disclosure.

FIG. 3 comparatively illustrate the deficiencies of the prior art structure as compared with an embodiment of the disclosure shown in FIG. 2. Referring to FIG. 3A, substrate 200 having an identical interconnect layout as that shown in FIG. 2A is provided. Conventional techniques fill the extended regions of substrate 200 with large dummy fills as shown in FIG. 3B. As can be seen from FIG. 3B, much of the edges and other regions of FIG. 3B are unfilled, creating an uneven pattern density. To address this problem, some conventional techniques deposit small dummy fills at extended regions and the edges. Nonetheless, this conventional approach leaves asymmetric pattern as indicated at FIG. 3C.

Figure 4:
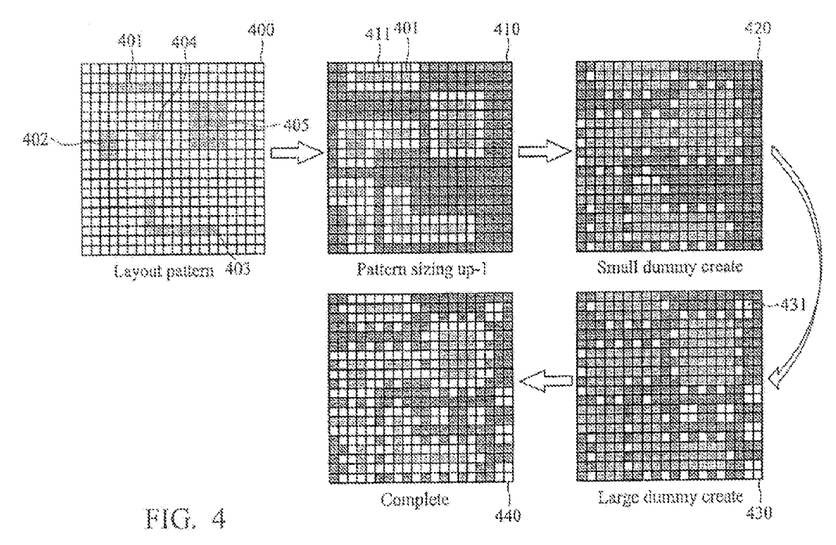
FIG. 4 schematically illustrates a method according to another embodiment of the disclosure.

FIG. 4 schematically illustrates a method according to another embodiment of the disclosure. Referring to FIG. 4, a layout pattern depicting substrate 400 having a layout pattern distribution of five interconnects (401, 402, 403, 404 and 405) on the surface thereof. Substrate 400 is subdivided to smaller cells. The interconnects are dispersed over the substrate according to the system architecture. In the next step, a negative pattern of substrate 400 including the layout pattern is obtained and shown as substrate 410. This step can be accomplished using conventional technologies. It should be noted that the negative of the substrate accounts for a blank area immediately adjacent to each of the five interconnect. Exemplary blank spaces (or forbidden region) 411 is shown surrounding interconnect 401. Other forbidden regions are formed about each interconnect as can be seen in FIG. 4. In the next step of the exemplary process, small dummy fills are created in substrate 410 to fill the blank spaces surrounding each interconnect (see substrate 420). Thereafter, large dummy fills 431 are formed on the negative to provide a more even pattern density. The completed negative substrate 440 can be used as a mask to form the desired pattern on the original layout pattern 400.

Figure 5:
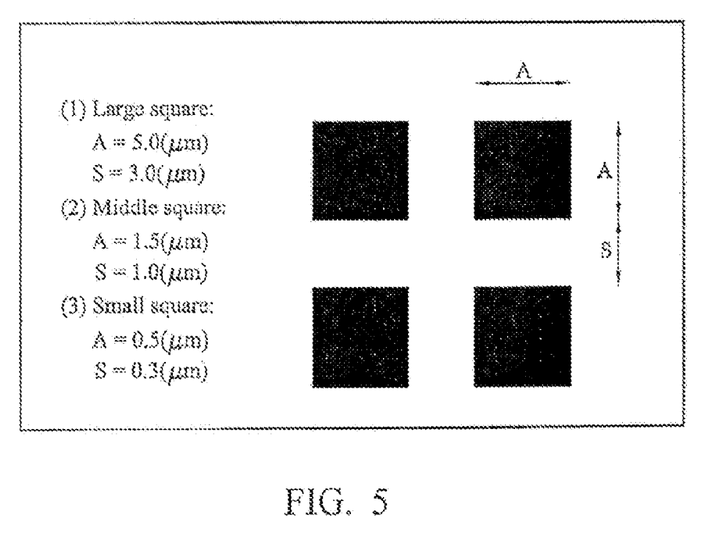
FIG. 5 is illustrates an exemplary design rule for dummy fill sizes.

FIG. 5 illustrates an exemplary design rule for dummy fill sizes. More specifically, FIG. 5 shows the three exemplary hierarchical levels of dummy fill structures. First, exemplary large dummy fills can have a surface area of about 5.0 μm and a separation distance (or blank space) of about 3.0 μm. The middle-sized dummy fills can have a surface area of about 1.5 μm and a separation distance of about 1.0 μm. Finally, the small dummy fills can have a surface area of about 0.5 μm and a blank spaces of about 0.3 μm. It should be noted that FIG. 5 represents an exemplary design rule and that the dummy shape is not limited to square- or rectangular shapes. In fact, the dummy shape can be a geometric or an amorphous shape. Moreover, within the same design different dummy shapes can be present without departing from the inventive concepts disclosed herein.

Figure 6A:
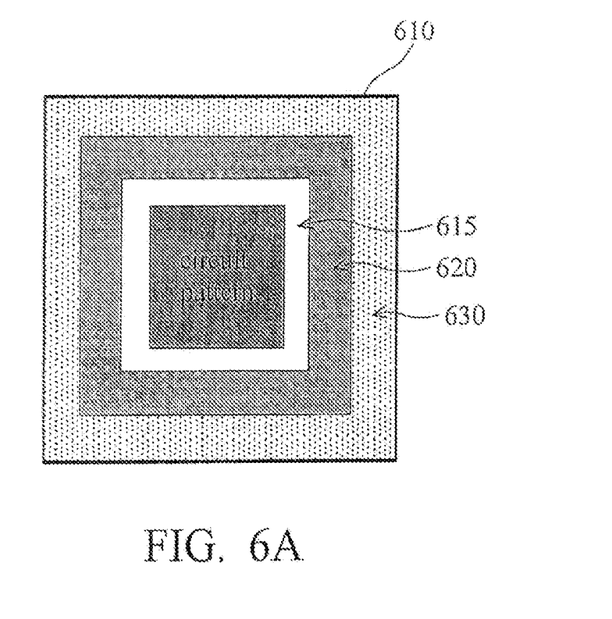
FIGS. 6A–6B illustrates some advantages of the embodiments disclosed herein.
Figure 6B:
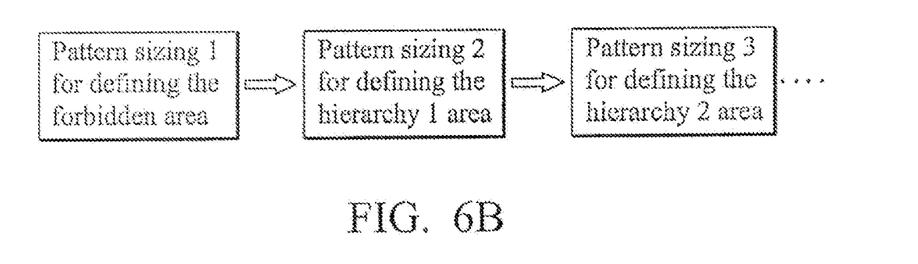

FIG. 6 illustrates some of the advantages of the embodiments disclosed herein. Specifically, in FIG. 6A, substrate 610 is shown to have a region of circuit pattern 615 (forbidden region). The forbidden region 615 is symmetric about the circuit pattern. The region identified as 620 and 630, respectively define, the first and the second hierarchy area (See FIG. 5). It can be readily seen from FIG. 6 that the dummy fill pattern surrounding the circuit according to the embodiments of the disclosure provides a symmetrical pattern. FIG. 6B shows an exemplary algorithm for a implementing the product of FIG. 6A. The process includes: (i) a first pattern sizing to define the forbidden area; (ii) a second pattern sizing to define the hierarchy area 1; and (iii) a third pattern sizing to define hierarchy area 2.

Figure 7:
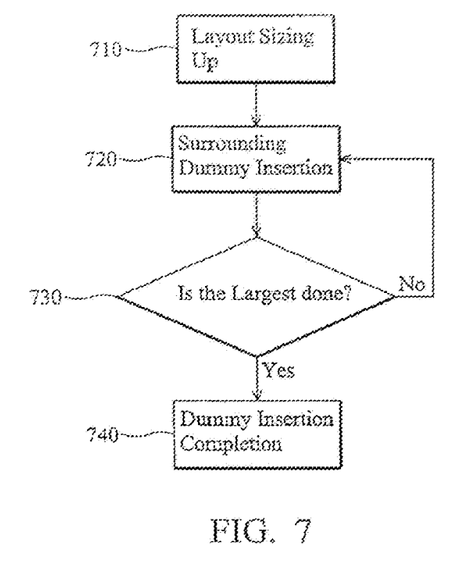
FIG. 7 is a flowchart illustrating an algorithm according to one embodiment of the disclosure.

FIG. 7 is a flowchart illustrating an algorithm according to one embodiment of the disclosure. In order to define the forbidden area (e.g., area 615, shown in FIG. 6B), the interconnect(s) on the substrate are identified and sized in step 710. In one embodiment, once the proportions of the interconnect are identified, a forbidden region is sized and disposed symmetrically about the interconnect. Using this identification, in step 720, a fist fill pattern is formed with the desired pattern density distribution to form a trace about the interconnect(s). In step 730 a determination is made as to whether the largest area of extended region (i.e., blank regions) have been filled with dummy structures. If not, the process of step 720 is repeated; alternatively, the insertion process is considered complete. In order to reduce the cycle time, the template library can be created.

Figure 8:
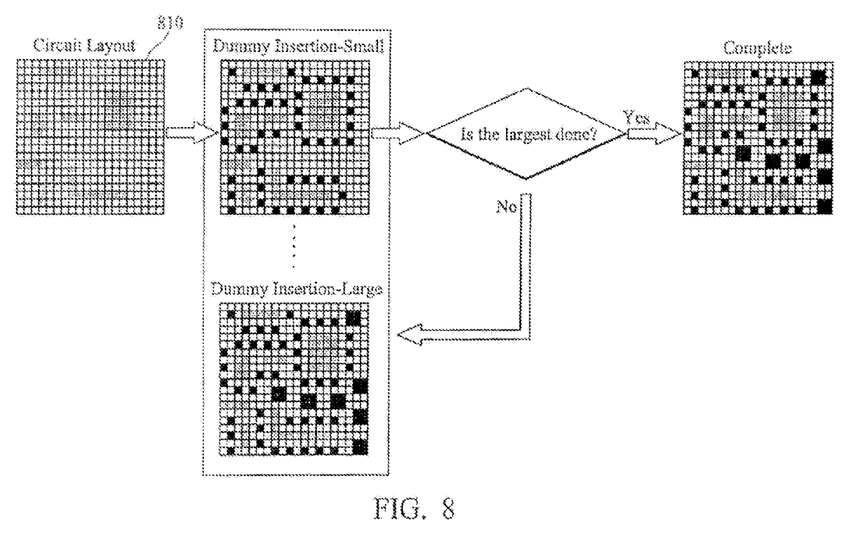
FIG. 8 is an exemplary flow chart for conducting a method of practicing one embodiment of the disclosure.

FIG. 8 is an exemplary flow chart for conducting a method of practicing one embodiment of the disclosure. More specifically, FIG. 8 provides a process-visual representation of the flow chart of FIG. 7. Referring to FIG. 8, a circuit layout of substrate 810 having a plurality of interconnects formed thereon are first obtained. Next, a first pattern having a plurality of small dummy fills is created. The first pattern forming a trace of small dummy fills about each of the interconnects in the layout. If large portion of blank areas exist on the substrate (i.e., extended areas), the algorithm endeavors to fill the extended regions with large dummy fills. The last step will be repeated until the entire substrate is appropriately filled.

The embodiments disclosed herein can be implemented using a specifically configured software. For example, a microprocessor can be programmed with instructions to identify a substrate having one or more interconnects formed thereon. An array of small dummy fills can form a trace adjacent to the interconnects to form a first fill pattern. The processor-implemented instruction can specify the size of each dummy fill and the distance of each dummy fill from one or more interconnects. The processor can then identify extended regions of the substrate which are void of pattern density. The extended regions can then be filled with small, medium or large dummy fills as needed to derive a more even pattern density distribution. The first and the second patterns can be implemented independently of each other. That is, the first and the second patterns can be positioned an asymmetric with respect to each other. In an alternative embodiment, the regions can be identified for depositing large dummy fills followed by formation of small dummy fills tracing each of the interconnects.

While the disclosure has been described in relation to certain exemplary embodiments presented herein, it should be noted that the principles of the disclosure are not limited thereto and include any modification, permutation or variation to the embodiments disclosed herein.

What is claimed is:

1. A method for generating dummy pattern to eliminate film pattern density mismatch, the method comprising:
   providing a substrate having a layout pattern density distribution thereon, the layout pattern density distribution defined by at least one interconnect on the surface of the substrate;
   defining a first fill pattern having a plurality of small dummy fills, the first fill pattern defining an array of small dummy fills corrugating a trace along the interconnect;
   identifying an extended region on the surface of the substrate, the extended region excluding the small dummy fills and the interconnect;
   defining a second fill pattern, the second fill pattern having at least one large dummy fill covering a portion of the extended region;
   wherein the second fill pattern defines an array independent of an array formed by the first fill pattern.

2. The method of claim 1, further comprising depositing a dielectric layer over the entire substrate after each for the first and the second fill patterns have been formed.

3. The method of claim 1, wherein each of the small dummy fills is separated from the interconnect by a distance.

4. The method of claim 1, wherein at least one small dummy fill is interposed between the interconnect and the large dummy fill.

5. The method of claim 1, wherein at least one large dummy fill is interposed between the interconnect and an edge of the substrate.

6. The method of claim 1, wherein the first fill pattern and the second fill pattern are asymmetric about the substrate.

7. The method of claim 1, wherein the corrugated trace encompasses the interconnect.

8. The method of claim 1, further comprising defining a forbidden region symmetrically surrounding the interconnect, said forbidden region void of the first or the second fill pattern.

9. A semiconductor prepared by the method of claim 1.

10. A method for generating dummy pattern, comprising:
    providing a substrate comprising a layout pattern thereon;
    identifying a forbidden region comprising the layout pattern and a space bordering the layout pattern;
    identifying a first dummy region around the forbidden region; and
    defining a first fill pattern comprising first dummy fills with the same size on the first dummy region, the first dummy fills arranged to form a trace alone the forbidden region.

11. The method of claim 10, further comprising:
identifying a second dummy region on the substrate, the second dummy region excluding the forbidden region and the first dummy region; and
defining a second fill pattern on the second dummy region, the second fill pattern comprising second dummy fills.

12. The method of claim 11, wherein at least one of the second dummy fills is larger than the first dummy fills.

13. The method of claim 10, wherein the line and the forbidden region are substantially identical in shape.

14. A method for generating dummy pattern, comprising:
providing a substrate comprising a layout pattern thereon;
identifying a forbidden region comprising the layout pattern and a space bordering the layout pattern;
identifying a first dummy region around the forbidden region; and
forming a fill pattern comprising first dummy fills with the same size on the first dummy region, the first dummy fills forming a trace along the layout pattern.

15. The method of claim 14, further comprising:
identifying a second dummy region on the substrate, the second dummy region excluding the forbidden region and the first dummy region; and
defining an asymmetrical fill pattern comprising second dummy fills on the second dummy region.

16. The method of claim 13, wherein at least one of the second dummy fills is larger than the first dummy fills.

* * * * *

UNITED STATES PATENT AND TRADEMARK OFFICE
CERTIFICATE OF CORRECTION

| | | |
|---|---|---|
| PATENT NO. | : 7,235,424 B2 | Page 1 of 1 |
| APPLICATION NO. | : 11/181433 | |
| DATED | : June 26, 2007 | |
| INVENTOR(S) | : Hsien-Wei Chen et al. | |

It is certified that error appears in the above-identified patent and that said Letters Patent is hereby corrected as shown below:

Column 6, line 66, delete "alone" and insert therefore -- along --.

Signed and Sealed this

Twentieth Day of November, 2007

JON W. DUDAS
*Director of the United States Patent and Trademark Office*